United States Patent
Babala et al.

(10) Patent No.: US 9,635,794 B2
(45) Date of Patent: Apr. 25, 2017

(54) METHOD AND APPARATUS FOR ATTACHMENT OF INTEGRATED CIRCUITS

(71) Applicant: TRW Automotive US LLC, Livonia, MI (US)

(72) Inventors: Mike Babala, Farmington Hills, MI (US); Jesse Theissen, South Lyon, MI (US)

(73) Assignee: TRW Automotive U.S. LLC, Livonia, MI (US)

( * ) Notice: Subject to any disclaimer, the term of this patent is extended or adjusted under 35 U.S.C. 154(b) by 728 days.

(21) Appl. No.: 13/716,890

(22) Filed: Dec. 17, 2012

(65) Prior Publication Data

US 2013/0215591 A1     Aug. 22, 2013

Related U.S. Application Data

(60) Provisional application No. 61/600,867, filed on Feb. 20, 2012.

(51) Int. Cl.
*H05K 13/08*     (2006.01)
*H05K 3/32*     (2006.01)
(Continued)

(52) U.S. Cl.
CPC ......... *H05K 13/0465* (2013.01); *H01L 22/14* (2013.01); *H01L 22/34* (2013.01);
(Continued)

(58) Field of Classification Search
CPC .............. Y10T 29/49004; H05K 13/08; H05K 13/0465
(Continued)

(56) References Cited

U.S. PATENT DOCUMENTS 3,718,970 A  *  3/1973  Stanish ................. G01H 13/00
                                                        204/192.12
5,010,447 A     4/1991  Wallace
(Continued)

FOREIGN PATENT DOCUMENTS

CN      1185037 A    6/1998
CN    202168276 U    3/2012
(Continued)

OTHER PUBLICATIONS

European Search Report EP 13 00 0858 completed Mar. 17, 2016 with search opinion.

*Primary Examiner* — Peter DungBa Vo
*Assistant Examiner* — Kaying Kue
(74) *Attorney, Agent, or Firm* — Tarolli, Sundheim, Covell & Tummino LLP

(57) ABSTRACT

Method and apparatus for bonding an electrical circuit component onto a substrate. A first electrically conductive bonding pad is formed on the component, and a second electrically conductive bonding pad is formed on the substrate. One of said first and second bonding pads is physically split into at least two parts, with electrical discontinuity between the two parts. An electrically conductive bond is formed between the first and second bonding pads such that electrical continuity is established from one part of the one bonding pad, through the other of the bonding pads, and through the second part of the one bonding pad. The integrity of the electrically conductive bond is evaluated by testing electrical continuity between the at least two parts.

9 Claims, 3 Drawing Sheets

(51) Int. Cl.
*H05K 13/04* (2006.01)
*H01L 21/66* (2006.01)
*H05K 1/02* (2006.01)
*H05K 1/18* (2006.01)

(52) U.S. Cl.
CPC .... *H05K 1/0268* (2013.01); *H01L 2924/0002* (2013.01); *H05K 1/181* (2013.01); *H05K 2201/10151* (2013.01); *H05K 2201/10727* (2013.01)

(58) Field of Classification Search
USPC .................. 29/593, 705, 832–841, 739–741
See application file for complete search history.

(56) References Cited

U.S. PATENT DOCUMENTS

| | | | | |
|---|---|---|---|---|
| 6,435,000 | B1* | 8/2002 | Takahashi | G01P 15/0922 73/1.38 |
| 6,729,176 | B2* | 5/2004 | Begin | G01C 21/28 73/1.38 |
| 7,010,855 | B2* | 3/2006 | Case | G02B 6/2555 29/593 |
| 8,881,370 | B2* | 11/2014 | Berger | B81B 7/0058 29/593 |
| 2002/0100310 | A1* | 8/2002 | Begin | G01C 21/28 73/1.37 |
| 2002/0125043 | A1 | 9/2002 | Yoshida | |
| 2002/0157314 | A1 | 10/2002 | Takada et al. | |
| 2006/0005629 | A1* | 1/2006 | Tokunaga | G01C 19/56 73/760 |
| 2007/0044998 | A1 | 3/2007 | Chan | |
| 2008/0013058 | A1* | 1/2008 | Tatsuzaki | F16F 9/52 355/53 |
| 2009/0153163 | A1 | 6/2009 | Han et al. | |
| 2010/0072862 | A1* | 3/2010 | Berger | B81B 7/0058 310/370 |
| 2010/0122565 | A1* | 5/2010 | Miller | G01P 21/00 73/1.37 |
| 2011/0113879 | A1* | 5/2011 | Matsunaga | G01C 19/56 73/504.12 |
| 2011/0186736 | A1* | 8/2011 | Yao | H01L 31/0203 250/338.4 |
| 2011/0198741 | A1 | 8/2011 | Alberghini et al. | |
| 2012/0025863 | A1 | 2/2012 | Ochs et al. | |
| 2012/0125096 | A1* | 5/2012 | Park | G01C 19/5783 73/504.12 |

FOREIGN PATENT DOCUMENTS

| | | |
|---|---|---|
| GB | 2416036 | 11/2006 |
| KR | 20090102209 | 9/2009 |
| KR | 1020090102209 A | 9/2009 |

\* cited by examiner

METHOD AND APPARATUS FOR ATTACHMENT OF INTEGRATED CIRCUITS

CROSS REFERENCE TO RELATED APPLICATION

The present application claims priority to U.S. provisional application No. 61/600,867 filed Feb. 20, 2012.

FIELD OF THE INVENTION

The present invention is directed to method and apparatus for secure and reliable bonding of an integrated circuit to a substrate.

BACKGROUND

Surface mount technologies are used in high volume electronics to mount integrated circuits ("ICs") and other active and passive components to a substrate, such as a printed circuit board ("PCB"). Solder paste is applied to solder pads that have been formed on the substrate, the components are precision-placed over the solder pads so that they are temporarily adhered to the pads by the solder paste, and then heat is applied to melt the paste and complete the solder connections between pins on the components and aligned solder pads on the PCB.

Often the solder is the only physical connection between the component and the PCB. This physical connection is generally sufficient, particularly where the component is small, multiple soldered connections exist between the component and the PCB, and the PCB is used in a benign environment generally free of vibration, shock, and other physical stress. However, to strengthen the attachment and enhance the durability of the solder connections, it is known to include on the bottom of a component an additional plate or tab, not used for electrical interconnection, to provide an additional area of solder bonding.

The use of surface mount technologies allows components to be mounted quite close together on the substrates. The resulting high component density is desirable, but can increase the risk that solder bridges will be formed at unplanned, and unwanted locations on the PCB. Where an additional tab is provided on a component to enhance bond strength, the tab will unfortunately create additional opportunities for unwanted solder bridges to arise.

SUMMARY OF THE INVENTION

The present invention provides a method and apparatus for securely bonding electrical components, including but not limited to ICs, to a PCB or other substrate while permitting detection of unwanted conductive bridges.

In accordance with the invention, an additional plate or tab arrangement is provided on the bottom of a component for bonding to a solder pad arrangement on the PCB, and the tab arrangement and solder pad arrangement are configured so that an electrical test can be used to confirm that the solder bond has been properly formed.

In accordance with one aspect of the invention, the electrical continuity from one solder pad, through the additional plate or tab, and through another solder pad is checked, with such continuity indicating that a proper solder bond has been formed.

BRIEF DESCRIPTION OF THE DRAWINGS

The foregoing and other features and advantages of the present invention will become more readily apparent to those skilled in the art to which the present invention relates upon reading the following description with reference to the accompanying drawings, in which.

DETAILED DESCRIPTION

Figure 1:
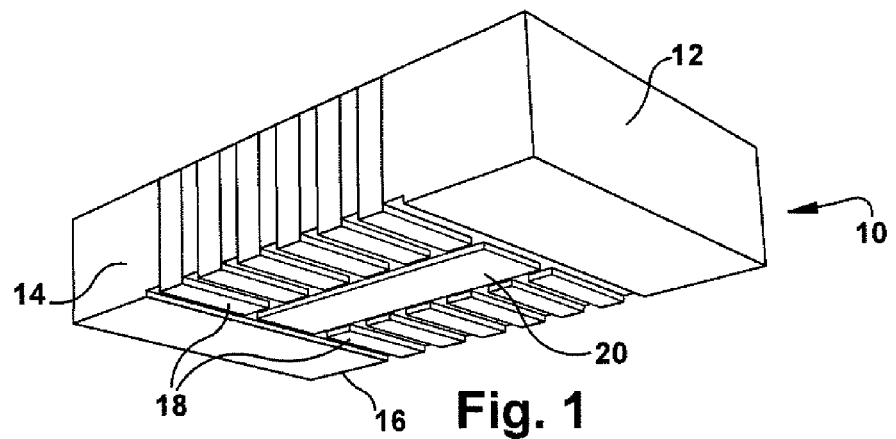
FIG. 1 is a perspective view of a simplified rendering of a dual leadless chip carrier ("dual LLCC") that has an additional attachment tab on its bottom surface.
Figure 2:
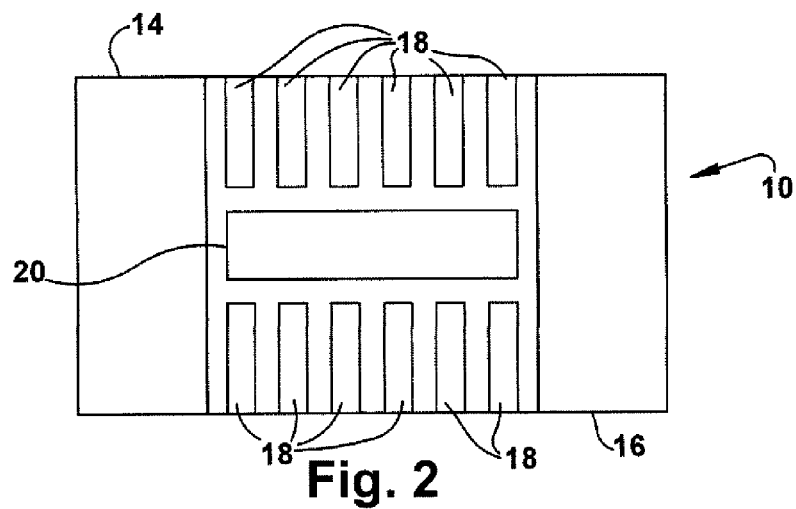
FIG. 2 is a bottom plan view of the dual LLCC of FIG. 1.

FIGS. 1 and 2 show an integrated circuit ("IC") 10 that may, for example, be a conventional inertial sensor. The IC 10 is shown as comprising a so-called dual "leadless chip carrier" ("LLCC") including a package 12 having opposing edges 14 and 16 each bearing a number of electrically conductive IC pins 18. The pins are wire bonded in a known manner to various connection points of the integrated circuit contained in the package, such as inputs, outputs, and power lines. The wire bonded connections are embedded in the package 12 and thus not visible in the figures.

Inertial sensors (e.g., single and multiple axis accelerometers, rate sensors, etc.) used in automotive safety systems must be robust against faults. Such inertial sensors are ICs, as for example illustrated in FIGS. 1 and 2, and are typically mounted to a PCB or other substrate using surface mount technologies. Surface mount technologies can be highly reliable and repeatable. Nonetheless, as explained above, it is possible that solder bridges may inadvertently arise during the soldering process. Failure mode and effects analyses (FMEA) are performed to identify the affects arising from the possible shorting of IC package pins to adjacent pins or to other circuit traces, particularly but not exclusively the power supply lines. With the FMEA in hand, the designer may take steps to avoid, or at least detect and mitigate, possible failure modes.

To add mechanical stability to a component's package, for extended solder life, and to enhance mechanical shock robustness, it is known to place a center tab 20 on the bottom of the IC for soldering to the PCB. The additional mechanical attachment provided by the center tab will strengthen the physical connection of the IC to the PCB, reduce package mechanical resonances, and also enhance the mechanical and electrical durability of the other solder connections.

The center tab 20 on the IC 10 is isolated, in the sense that it is not electrically connected within the IC itself to any other element of the packaged circuit. However, the inventors have recognized that the center tab could be electrically connected to something else via the mating solder pad or trace on the PCB. By means of the mating solder pad on the PCB, the center tab could for example be connected electrically to a supply line, such as electrical ground. Alternatively, the solder pad itself could be left electrically floating.

If the tab 20 were left floating, and a single active pin were to short to the tab, there would be no effect. However, if a second active pin were then also to short to the tab, the two active pins would be effectively shorted together with possibly undesirable consequences. To properly consider and account for such consequences, the FMEA analysis would generally have to evaluate the effects of any pin shorting to any other pin. This analysis and any consequent mitigation actions would be more complicated than just considering potential shorts between adjacent pins. For these reasons, it is undesirable to leave the center tab electrically floating.

If the center tab 20 is instead soldered to the PCB and is electrically connected to a supply line (e.g., ground, Vdd or Vss) via a circuit trace on the PCB, the possible failure mode permutations are reduced in number and are thus easier to evaluate in a FMEA. Unfortunately, the center tab cannot easily be inspected for a good solder connection to ensure it has been thus electrically connected (e.g., grounded) at the time of manufacture.

According to the present invention, a method and apparatus is provided for ensuring that the center tab 20 is soldered and electrically connected. In particular, the PCB circuit trace artwork and the IC package are designed so as to form a continuity path that can be tested to confirm continuity and thus verify that a good solder connection between the PCB and the tab 20 has been established.

Figure 3:
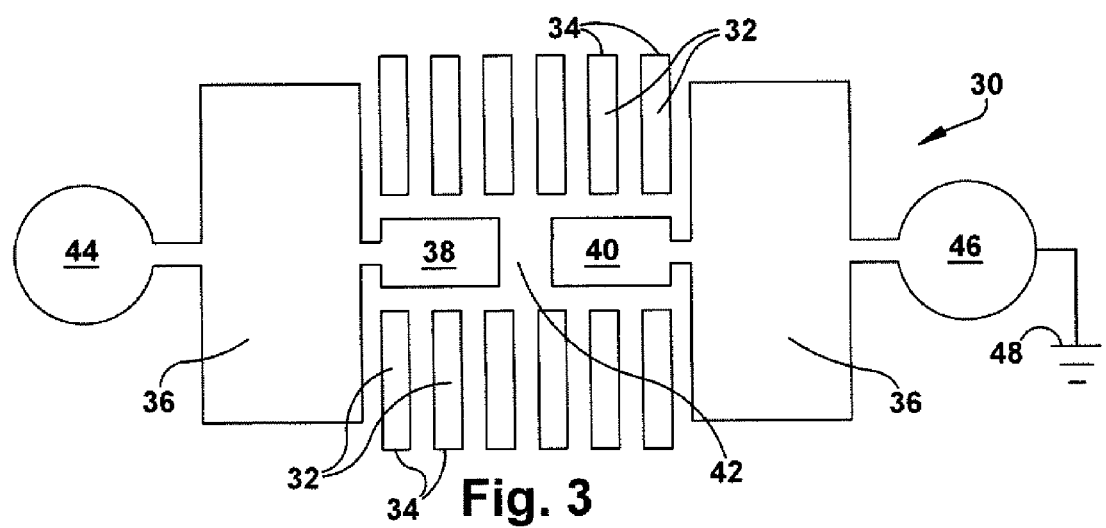
FIG. 3 is a top plan view of circuit traces and solder pads to be used on the surface of a PCB or other substrate, in accordance with one example embodiment of the present invention, for mounting of the dual LLCC of FIG. 1.

FIG. 3 illustrates one example of PCB artwork that, in conjunction with the IC 10 of FIGS. 1 and 2, would allow such a continuity check. In FIG. 3, the conductive circuit traces are indicated at 30 but the PCB itself is not shown. The area between the traces is, of course, nonconductive. Further, the conductive traces shown in the figure comprise primarily the solder pads 32 themselves with some additional distal length 34; the traces leading from the distal ends of the solder pads to the other components on the PCB (e.g., power supply, microcomputer, etc.) are not shown.

In FIG. 3 it can be seen that a solder pad 36 is provided for bonding to the center tab 20 of IC 10. Pad 36 has a split configuration, including two pad ends 38 and 40 that are electrically discontinuous; that is, they are separated by a nonconductive gap 42. In the embodiment shown in FIG. 3, each pad end 38 and 40 has associated therewith a respective test probe landing target 44 and 46. At the time of manufacture, test probes will be placed on at least one of the landing targets to assess continuity between the two pad ends. Prior to mounting of the IC 10, the two pad ends will be electrically isolated from one another and thus there will be no electrical continuity between them.

Figure 4:
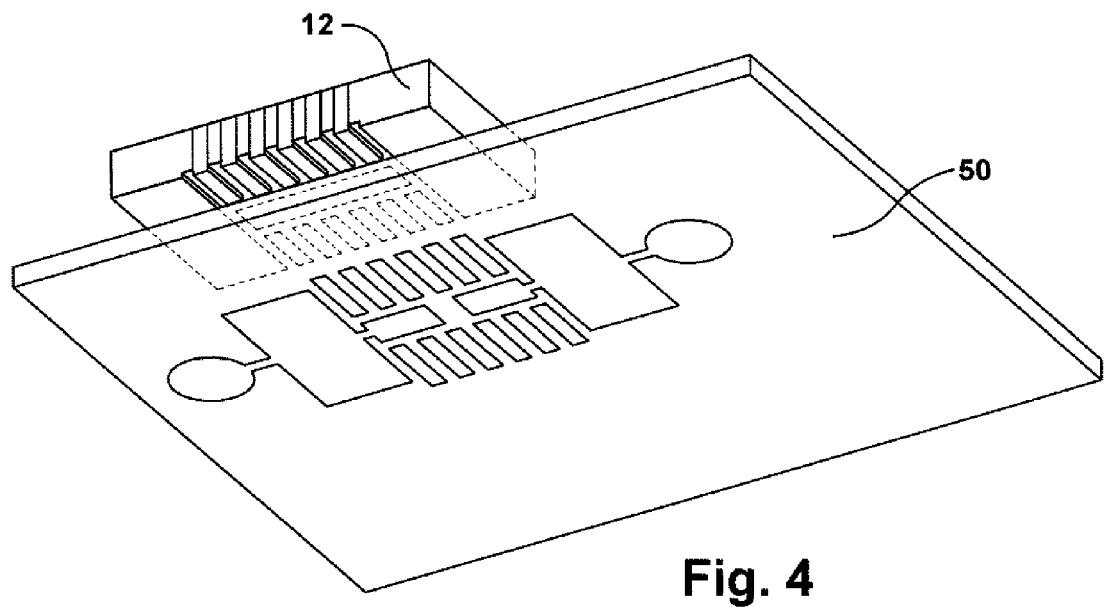
FIG. 4 is a perspective view of the dual LLCC of FIG. 1 oriented above a PCB carrying the circuit traces and solder pads of FIG. 3.
Figure 5:
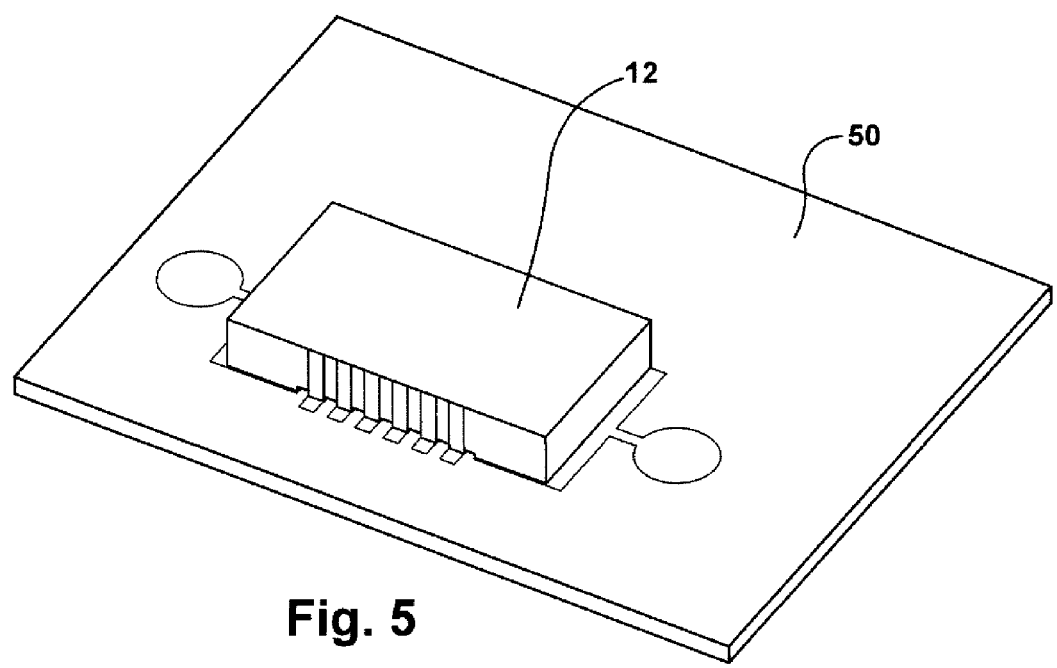
FIG. 5 is a perspective view of the dual LLCC of FIG. 1 in place on the PCB and aligned with the circuit traces of FIG. 4; and, FIG. 6 is a schematic circuit diagram showing the manner in which the dual LLCC is connected to other circuit components via the mounting arrangement shown in FIGS. 1-5.

The PCB will be populated with the IC 10 shown in FIG. 1 as well as various other electrical components that are not shown in the figures. To this end, solder paste will first be applied to all of the solder pads, including the two pad ends 38 and 40, and the IC 10 will be precision-lowered onto the circuit traces of FIG. 3, as shown in the representations of FIGS. 4 and 5. For convenience of description, the PCB 50 is shown in translucent shadow in FIGS. 4 and 5. The PCB will then be heated in a conventional manner to melt the paste the solder therein thereby to form the respective solder bonds between the pins of the IC and the pads on the PCB. If the bonds are properly formed, one end of the center tab 20 will be soldered to pad end 38 and the other end of the center tab 20 will be soldered to pad end 40, whereby the center tab 20 will establish a short between the two solder pad ends and thus electrical continuity between them.

In FIG. 3, the rightward probe landing target 46 associated with pad end 40 is schematically shown as connected to electrical ground at 48. This is accomplished on the PCB by an additional circuit trace, not shown. Thus, when the IC is properly soldered in place, all of the circuit traces shown in FIG. 3 will be grounded, except for the solder pads to which the edge pins of IC 10 are soldered (although one or more of those pins maybe grounded as well). To confirm solder integrity to the center tab in this embodiment, it is only necessary to check the continuity to ground of the probe landing target 44.

Figure 6:
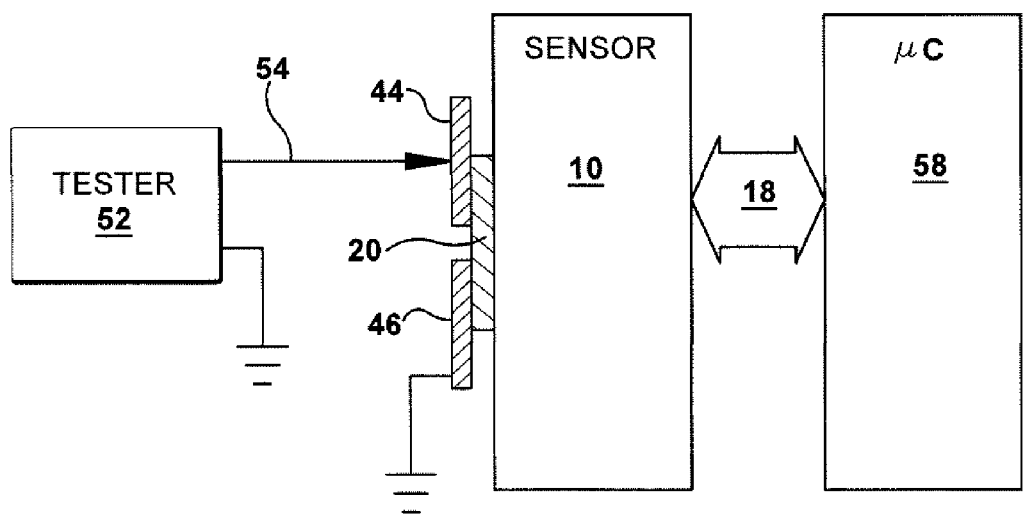

FIG. 6 illustrates the electrical connections of the elements described thus far. In the figure, the pins 18 of the IC 10 are connected to respective leads of other components on the PCB such as, for example, a microprocessor or state machine 58. A test device 52 has a probe 54 that may be brought into contact with the probe landing pad end 44. The test device 52 provides a test current through the pad end 44, and measures the resulting voltage appearing on the pad end. If good continuity to ground exists, the voltage on the pad 44 will remain zero despite the test current. Thus, a zero voltage reading will indicate that continuity exists and that good solder connections have been formed. Empirical testing can be used to determine the maximum voltage reading that can be expected when good solder connections have been formed. If the test voltage reading is below that maximum voltage, the PCB will be considered to have passed this test. If the test voltage reading is above that maximum voltage, the PCB will be considered to have failed this test.

Various alternatives to the described embodiment are contemplated. It is contemplated, for example, that the continuity check could be done through a different supply voltage line rather than running to electrical ground in the illustrated manner. Also, in place of a dc test voltage, some more sophisticated, time varying signal could be used to measure bond impedance more comprehensively. It is also noted that the continuity check could be performed by circuitry native to the PCB rather than the illustrated external test system. For example, the continuity check could be performed by a host microcomputer during startup of the system or periodically during system runtime, e.g. through a suitable test routine included in the software (firmware) program that is stored in and executed by the microcomputer. Further, the center pad could be divided into any number of segments, rather than merely the illustrated two segments.

Also, the continuity check function could be implemented directly in the IC itself rather than on the PCB. In this case, the respective functions of the center tab on the IC (shorting bar) and the pad ends on the PCB (continuity test points) will be reversed. In other words, the center tab on the IC will be split into two isolated ends, and the matching solder pad on the PCB will be a single trace. Thus, the solder pad will then short across the two isolated parts of the center tab. The two parts of the center tab will be bonded to circuit elements within the IC that will perform the continuity check between them.

The mounting arrangement of the present invention permits verification that a sound mechanical and electrical connection is formed between the tab and the PCB. Since the center tab is connected to ground, or alternatively to a supply line voltage, the number of FMEA evaluations that are needed is substantially reduced since an IC pin can only short to an adjacent pin or to the center tab. The FMEA does not have to account for possible shorts of one pin to all other pins as would be needed if the center tab were allowed to electrically float.

The details of one or more embodiments of the invention are set forth in the accompanying drawings and the descrip- Having described the invention, the following is claimed:

1. A method for evaluating the bond between an inertial sensor and a substrate, comprising the steps of:
    fixing a first electrically conductive bonding pad to said inertial sensor;
    fixing a second electrically conductive bonding pad to said substrate;
    splitting one of said first electrically conductive bonding pad and said second electrically conductive bonding pad into at least first part and second part so as to have electrical discontinuity between said first part and said second part;
    forming an electrically conductive bond between said first electrically conductive bonding pad and said second electrically conductive bonding pad such that electrical continuity is established from said first part of said one of said first electrically conductive bonding pad and said second electrically conductive bonding pad, through the other said first electrically conductive bonding pad and said second electrically conductive bonding pad, and through said second part of said one of said first electrically conductive bonding pad and said second electrically conductive bonding pad; and
    testing electrical continuity between said at least two parts so as to thereby evaluate the integrity of the electrically conductive bond; and
    forming multiple pins around the edges of a leadless chip carrier for electrical connection to other components on said substrate, and connecting a microprocessor device to said inertial sensor pins, wherein the inertial sensor is packaged in said leadless chip carrier,
    and wherein said step of fixing said first electrically conductive bonding pad to said inertial sensor comprises the step of fixing said first electrically conductive bonding pad to said inertial sensor such that said pad is at least partially located on the bottom surface of said leadless chip carrier between said edges.

2. A method as set forth in claim 1, wherein said circuit trace to which said one of said first and second parts is connected to an electrical ground.

3. A method as set forth in claim 1, wherein said steps of fixing said first electrically conductive bonding pad to said inertial sensor is performed such that said first electrically conductive bonding pad is not directly connected to said multiple pins.

4. A method as set forth in claim 1, further including the step of testing for short circuits between one of said pins and one of said first and second electrically conductive bonding pads.

5. A method as set forth in claim 1, wherein the step of fixing said first electrically conductive bonding pad includes the step of forming said first electrically conductive bonding pad as a single continuous pad, wherein the step of fixing said second electrically conductive bonding pad includes the step of forming said second electrically conductive bonding pad as at least first and second parts with electrical discontinuity between said first and second parts, and wherein said step of forming said electrically conductive bond comprises the step of soldering each of said first and second parts of said second electrically conductive bonding pad to said first electrically conductive bonding pad, whereby electrical continuity is established between said first and second parts through said first electrically conductive bonding pad and the respective solder connections.

6. A method as set forth in claim 1, and further comprising the step of programming said microprocessor device to test the electrical continuity between said two parts.

7. A method as set forth in claim 1, wherein said substrate further comprises circuit traces adapted for connection to a power source, and wherein said method further comprising the step of connecting said first part to one of said traces and said second part to a test landing pad whereby an external tester may be used to check for a good connection from the test landing pad through the first and second electrically conductive bonding pads to said trace.

8. A method as set forth in claim 7, and further comprising the step of connecting an external tester between said landing pad and said trace and checking for a good connection from said test landing pad to said trace with said tester.

9. A method as set forth in claim 1, wherein said step of fixing said first electrically conductive bonding pad to said inertial sensor comprises the step of forming said first electrically conductive bonding pad in first and second parts and wherein said method further includes the step of testing for electrical continuity between said first and second parts with electrical circuitry contained in said substrate.

* * * * *